US012595167B2

(12) United States Patent
Chen et al.

(10) Patent No.: US 12,595,167 B2
(45) Date of Patent: Apr. 7, 2026

(54) DUAL MICRO-ELECTRO MECHANICAL SYSTEM AND MANUFACTURING METHOD THEREOF

(71) Applicant: Taiwan Semiconductor Manufacturing Company, Ltd., Hsinchu (TW)

(72) Inventors: Yang-Che Chen, Hsinchu City (TW); Victor Chiang Liang, Hsinchu City (TW); Chen-Hua Lin, Douliu City (TW); Chwen-Ming Liu, Hsinchu (TW); Huang-Wen Tseng, Zhubei City (TW); Yi-Chuan Teng, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/640,142

(22) Filed: Apr. 19, 2024

(65) Prior Publication Data

US 2024/0262681 A1 Aug. 8, 2024

Related U.S. Application Data

(60) Continuation of application No. 17/694,296, filed on Mar. 14, 2022, now Pat. No. 11,993,512, which is a
(Continued)

(51) Int. Cl.
| | |
|---|---|
| *B81B 7/04* | (2006.01) |
| *B81C 3/00* | (2006.01) |
| *B81C 1/00* | (2006.01) |

(52) U.S. Cl.
CPC ............... *B81B 7/04* (2013.01); *B81C 3/001* (2013.01); *B81B 2201/033* (2013.01);
(Continued)

(58) Field of Classification Search
CPC ............... B81B 7/04; B81B 2201/033; B81B 2203/0136; B81B 2203/0307;
(Continued)

(56) References Cited

U.S. PATENT DOCUMENTS

| | | | |
|---|---|---|---|
| 7,871,687 | B2 | 1/2011 | Kouma et al. |
| 9,520,812 | B2 | 12/2016 | Maeda |

(Continued)

FOREIGN PATENT DOCUMENTS

| | | |
|---|---|---|
| CN | 101152955 A | 4/2008 |
| CN | 101173958 A | 5/2008 |

(Continued)

OTHER PUBLICATIONS

Notice of Allowance issued in U.S. Appl. No. 16/937,710, dated Nov. 3, 2021.
(Continued)

*Primary Examiner* — Yasser A Abdelaziez
(74) *Attorney, Agent, or Firm* — STUDEBAKER BRACKETT PLLC

(57) ABSTRACT

A micro electro mechanical system (MEMS) includes a circuit substrate, a first MEMS structure disposed over the circuit substrate, and a second MEMS structure disposed over the first MEMS structure.

20 Claims, 14 Drawing Sheets

Related U.S. Application Data division of application No. 16/937,710, filed on Jul. 24, 2020, now Pat. No. 11,274,037.

(60) Provisional application No. 62/928,048, filed on Oct. 30, 2019.

(52) U.S. Cl.
CPC ................ *B81B 2203/0136* (2013.01); *B81B 2203/0307* (2013.01); *B81B 2203/04* (2013.01); *B81C 1/00357* (2013.01); *B81C 1/00468* (2013.01); *B81C 1/00476* (2013.01); *B81C 1/00484* (2013.01); *B81C 2201/0132* (2013.01); *B81C 2203/038* (2013.01)

(58) Field of Classification Search
CPC ... B81B 2203/04; B81B 3/0072; B81C 3/001; B81C 1/00357; B81C 1/00468; B81C 1/00476; B81C 1/00484; B81C 2201/0132; B81C 2203/038
See application file for complete search history.

(56) References Cited

U.S. PATENT DOCUMENTS

| | | | |
|---|---|---|---|
| 9,617,147 | B2 | 4/2017 | Chu et al. |
| 10,190,938 | B2 | 1/2019 | Blomqvist et al. |
| 10,508,023 | B2 | 12/2019 | Cheng et al. |
| 10,867,976 | B2 | 12/2020 | Chen et al. |
| 11,186,481 | B2 | 11/2021 | Yang et al. |
| 2009/0293617 | A1 | 12/2009 | McNeil et al. |
| 2011/0193573 | A1 | 8/2011 | De Boer et al. |
| 2012/0139064 | A1 | 6/2012 | Nakatani et al. |
| 2012/0262026 | A1* | 10/2012 | Lin ...................... B81B 3/0072 310/300 |
| 2013/0105921 | A1* | 5/2013 | Najafi .................. G01C 19/574 257/E29.324 |
| 2014/0206123 | A1 | 7/2014 | Chu et al. |
| 2014/0312435 | A1* | 10/2014 | Geisberger ............ B81B 7/0048 438/52 |
| 2015/0284240 | A1* | 10/2015 | Chu .................... B81C 1/00293 438/51 |
| 2016/0119722 | A1 | 4/2016 | Chu et al. |
| 2016/0187370 | A1* | 6/2016 | Ikehashi ............. G01L 19/0618 73/514.32 |
| 2018/0111824 | A1 | 4/2018 | Wu et al. |
| 2018/0115836 | A1 | 4/2018 | Hsieh et al. |
| 2019/0098418 | A1 | 3/2019 | Hermes et al. |
| 2020/0071157 | A1 | 3/2020 | Yang et al. |
| 2021/0047175 | A1 | 2/2021 | Chu et al. |
| 2021/0047176 | A1 | 2/2021 | Cheng et al. |

FOREIGN PATENT DOCUMENTS

| | | |
|---|---|---|
| CN | 102064021 A | 5/2011 |
| CN | 102753931 A | 10/2012 |
| CN | 103449352 A | 12/2013 |
| CN | 103964376 A | 8/2014 |
| CN | 107818974 A | 3/2018 |
| CN | 108027386 A | 5/2018 |
| CN | 110015632 A | 7/2019 |
| JP | 2010107521 A | 5/2010 |
| TW | 201532287 A | 8/2015 |
| TW | 201830598 A | 8/2018 |
| WO | 2017061638 A1 | 4/2017 |

OTHER PUBLICATIONS

Non-Final Office Action issued in U.S. Appl. No. 17/694,296, dated Sep. 14, 2023.
Notice of Allowance issued in U.S. Appl. No. 17/694,296, dated Jan. 19, 2024.

* cited by examiner

200

290

223Y

230

222Y

220Y

221Y

240

223X

221X

220X

222X

210

50

210

210

210

55

300

330
390

320

330Y

330X

310

50

55

330

DUAL MICRO-ELECTRO MECHANICAL SYSTEM AND MANUFACTURING METHOD THEREOF

RELATED APPLICATIONS

This application is a continuation of U.S. application Ser. No. 17/694,296 filed Mar. 14, 2022, which is a divisional of U.S. application Ser. No. 16/937,710 filed Jul. 24, 2020, now U.S. Pat. No. 11,274,037, which claims priority of U.S. Provisional Patent Application No. 62/928,048 filed on Oct. 30, 2019, the entire contents of each of which are incorporated herein by reference.

BACKGROUND

Micro-electro mechanical system (MEMS) devices have recently been developed. MEMS devices include devices fabricated using semiconductor technology to form mechanical and electrical features. The MEMS devices are implemented in pressure sensors, microphones, actuators, mirrors, heaters, and/or printer nozzles. Although existing devices and methods for forming the MEMS devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
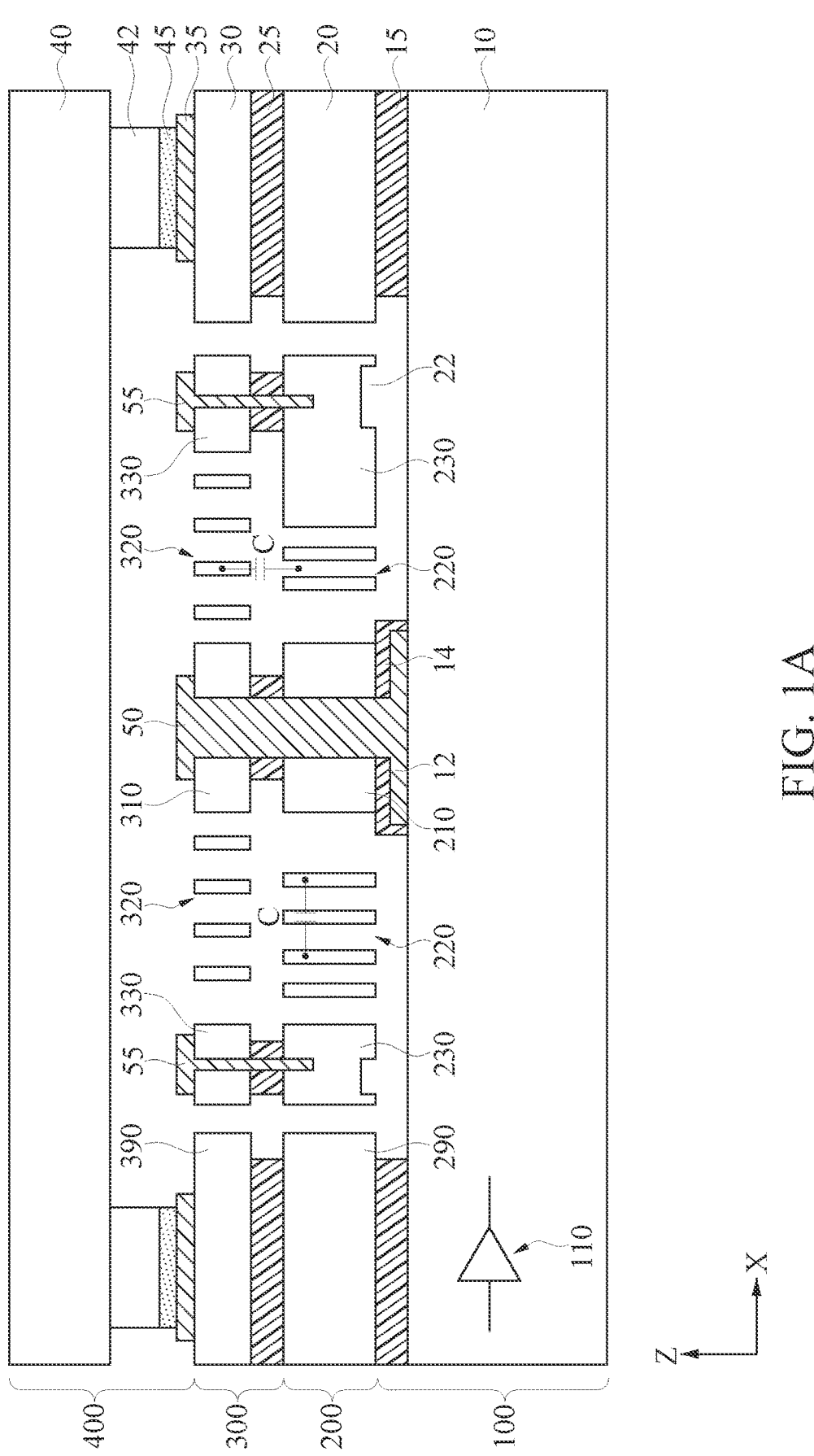
FIG. 1A shows a schematic cross sectional view of a dual MEMS device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, at least one of A, B and C means "A," "B," "C," "A and B," "A and C," "B and C," or "A, B and C," and does not mean that one from A, one from B and one from C, unless otherwise indicated.

A current MEMS device generally includes only one MEMS structure (layer) to form a proof mass structure, a support spring and sensor electrode, and the MEMS structure is disposed over a substrate. The single MEMS device includes capacitors formed by X and Y sensing electrodes, and by the MEMS structure and bottom electrodes disposed on the substrate. However, in the single MEMS device, offsets caused by capacitance shifts due to un-wanted electrode gaps easily change. This is because the MEMS structure and the bottom electrodes are all directly connected to the substrate, and thus they deform or move together when the MEMS device is subjected to mechanical or thermal loads from package process and ambient environment.

In addition, in the single MEMS structure, the MEMS patterns are formed by patterning a silicon layer disposed over the substrate with a gap by plasma dry etching. The plasma enters the gap and causes damage on the bottom surface of the MEMS patterns. Further, when the substrate includes a CMOS circuit, the plasma also causes damage to the CMOS circuit. Moreover, when a wet etching operation is employed to remove a dielectric layer for releasing the MEMS patterns, heavy and large patterns, such as a proof mass structure, may stick to the substrate due to surface tension of a wet etchant.

The embodiments of the present disclosure solve the aforementioned problems in a single MEMS device.

Figure 1B:
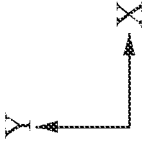
FIG. 1B shows a plan view of a first MEMS structure.
Figure 1C:
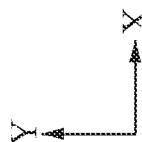
FIG. 1C shows a plan view of a second MEMS structure according to an embodiment of the present disclosure.

FIG. 1A shows a schematic cross sectional view of a dual MEMS device according to an embodiment of the present disclosure. FIG. 1B shows a plan view of a first MEMS structure, and FIG. 1C shows a plan view of a second MEMS structure according to an embodiment of the present disclosure.

As shown in FIG. 1A, the dual MEMS device includes a substrate 100, a first MEMS structure 200 disposed over the substrate, a second MEMS structure 300 disposed over the first MEMS structure, and a cover layer 400 disposed over the second MEMS structure 300. A first dielectric layer 15 is disposed between the substrate 100 and the first MEMS structure 200 to connect them, and a second dielectric layer 25 is disposed between the first MEMS structure 200 and the second MEMS structure 300 to connect them.

In some embodiments, the first and/or second dielectric layers 15, 25 are made of silicon oxide. Other dielectric material such as silicon oxynitride, silicon nitride or aluminum oxide are used as the first and/or second dielectric layers in some embodiments.

In some embodiments, the substrate 100 includes electronic circuitry 110, such as a signal processing circuit and/or an amplifier circuit, formed by CMOS circuitry. In some embodiments, the electronic circuitry 110 receives signals from the first and/or second MEMS structure 200, 300 and processes the signals.

As shown in FIG. 1B, in some embodiments, the first MEMS structure 200 is formed by a first substrate 20 shown in FIG. 1A, and includes one or more first anchor structures 210 (anchor) and a first proof mass structure (proof mass) 230. In some embodiments, the first substrate 20 is a doped silicon crystalline substrate. In some embodiments, a frame structure 290 surrounds the first proof mass structure 230.

In some embodiments, the first poof mass structure 230 is supported by four spring support structures 240 which are connected to the anchor structures 210, respectively. The four first anchor structures 210 connected to the spring support structures 240 are separated from each other in some embodiments.

In some embodiments, the first proof mass structure 230 has a frame shape. In other embodiments, the first proof mass structure 230 includes two or more divided structures. In some embodiments, each of the divided poof mass structure has a rectangular shape. In some embodiments, the first proof mass structure 230 is electrically connected to the electronic circuitry 110 of the substrate 100 through the first anchor structure 210 and a first via electrode 50 formed in the anchor structure 210.

In some embodiments, the spring support structure 240 has a pulse-wave shape as shown in FIG. 1B. In other embodiments, the spring support structure 240 has one or more thin rectangular structures.

The first MEMS structure 200 further includes a first capacitor structure 220X including comb electrodes 221X and comb electrode 222X as shown in FIG. 1B. The first capacitor structure 220X is provided for detecting movement of the proof mass structure (caused by, e.g., acceleration and/or force) along the X direction as a capacitance change. In some embodiments, two first capacitor structures 220X are provided at point symmetric positions with respect to the center of the first MEMS structure. The comb electrodes 221X protrude in the X direction from an X-arm structure 223X extending in the Y direction as fixed electrodes, and comb electrodes 222X protrude in the X direction from the first proof mass structure 230 as moving electrodes, in some embodiments. The X-arm structure 223X is connected to a first anchor structure 210 and the first anchor structure 210 is electrically connected to the electronic circuitry 110 of the substrate 100 through a first via electrode 50 formed in the anchor structure 210. Movement of the proof mass structure changes facing areas between the comb electrodes 221X and 222X, which in turn causes a capacitance of the first capacitor structure 220X.

Similarly, the first MEMS structure 200 further includes a second capacitor structure 220Y including comb electrodes 221Y and comb electrode 222Y as shown in FIG. 1B. The second capacitor structure 220Y is provided for detecting movement of the proof mass structure along the Y direction as a capacitance change. In some embodiments, two second capacitor structures 220Y are provided at point symmetric positions with respect to the center of the first MEMS structure. The comb electrodes 221Y protrude in the Y direction from a Y-arm structure 223Y extending in the X direction as fixed electrodes, and comb electrodes 222Y protrude in the Y direction from the first proof mass structure 230 as moving electrodes, in some embodiments. The Y-arm structure 223Y is connected to a first anchor structure 210 and the first anchor structure 210 is electrically connected to the electronic circuitry 110 of the substrate 100 through a first via electrode 50 formed in the anchor structure 210.

As shown in FIG. 1A, in some embodiments, a bottom face of the first proof mass structure 230 facing the circuit substrate 100 includes one or more stopper patterns 22. The stopper pattern 22 is a recess and/or a groove formed in the bottom face of the first proof mass structure 230. The stopper pattern 22 is configured to prevent sticking of a floating large structure, such as proof mass structure, to a substrate (e.g., the circuit substrate 100) facing the floating large structure, during manufacturing operations. Similarly, a bottom face of the second proof mass structure 330 facing the first MEMS structure 200 includes one or more stopper patterns.

As shown in FIG. 1C, in some embodiments, the second MEMS structure 300 is formed by a second substrate 30 shown in FIG. 1A, and includes one or more second anchor structures 310 (anchor) and one or more proof mass structures (proof mass) 330. In some embodiments, the second substrate 30 is a doped silicon crystalline substrate. In some embodiments, a frame structure 390 surrounds the second proof mass structures 330.

In some embodiments, the second anchor structure 310 is physically and electrically connected to the first anchor structure 210 of the first MEMS structure 200 through a first via electrode 50. The second proof mass structure 330 of the second MEMS structure 300 is physically and electrically connected to the first proof mass structure 230 of the first MEMS structure 200 through one or more second via electrodes 55. In some embodiments, the second proof mass structure 330 extends along the Y direction as shown in FIG. 1C.

In some embodiments, an X-arm structure 330X and a Y-arm structure 330Y extend from the second anchor structure 310 as shown in FIG. 1C. In some embodiments, comb electrodes 320 protrude from the Y-arm structure in both X directions (+X and −X) as shown in FIG. 1C. In other embodiments, comb electrodes additionally or alternatively protrude from the X-arm structure in both Y directions. In some embodiments, the comb electrode 320 of the second MEMS structure overlap the moving comb electrodes 222X and/or 222Y of the first and/or second capacitor structures 220X, 220Y, so that the comb electrode 320 of the second MEMS structure and the moving comb electrodes 222X, 222Y of the first and/or second capacitor structures 220X, 220Y constitute a capacitor for detecting Z-direction movement as a capacitance change.

In other embodiments, comb electrodes protrude from the second proof mass structures 330. In such a case, the comb electrodes of the second MEMS structure and fixed comb electrodes 221X, 221Y of the first MEMS structure constitute a capacitor for detecting Z-direction movement as a capacitance change.

As shown in FIG. 1A, the second via electrodes 55 pass through the second proof mass structure 330, the second dielectric layer 25 and penetrate into the first proof mass structure 230 of the first MEMS structure 200 in some embodiments. In some embodiments, the bottom of the second via electrode 55 is located at the middle of the first proof mass structure 230. Here, the "middle" means a range from 10% of the thickness of the first proof mass structure 230 from the bottom surface of the first proof mass structure 230 to 10% of the thickness of the first proof mass structure 230 from the top surface of the first proof mass structure 230.

The cover layer 400 is made of crystalline silicon in some embodiments. In some embodiments, the crystalline silicon is doped crystalline silicon. The cover layer 400 includes a main body 40 and a leg portion 42 as shown in FIG. 1A. The cover layer 400 is attached to the second MEMS structure 300 through the leg portion 42. In some embodiments, the frame 390 of the second MEMS structure 300 includes a first bonding layer 35 and the leg portion 42 of the cover layer 400 includes a second bonding layer 45. The second bonding layer 45 is bonded to the first bonding layer 35 by eutectic bonding in some embodiments. In some embodiments, the first bonding layer includes Al or an Al alloy, such as AlCu. Copper, gold, silver and alloys thereof are also used for the first bonding layer in some embodiments. In some embodiments, the second bonding layer 45 includes Ge or a Ge alloy.

In some embodiments, the cover layer 400 has no opening, and thus the cover layer 400 seals the first and second MEMS structures 200, 300 in an airtight manner. In other embodiments, the cover layer 400 includes one or more opening so that moving parts of the first and second MEMS structures communicate with the outside the MEMS device to receive pressure (e.g., air pressure, sound pressure) from outside the MEMS device.

FIGS. 2-13 show various stages of manufacturing operations for a MEMS device in accordance with an embodiment of the present disclosure. It is understood that additional operations can be provided before, during, and after the processes shown by FIGS. 2-13, and some of the operations described below can be replaced or eliminated, for additional embodiments of the method. The order of the operations/processes may be interchangeable.

Figures 2, 3:
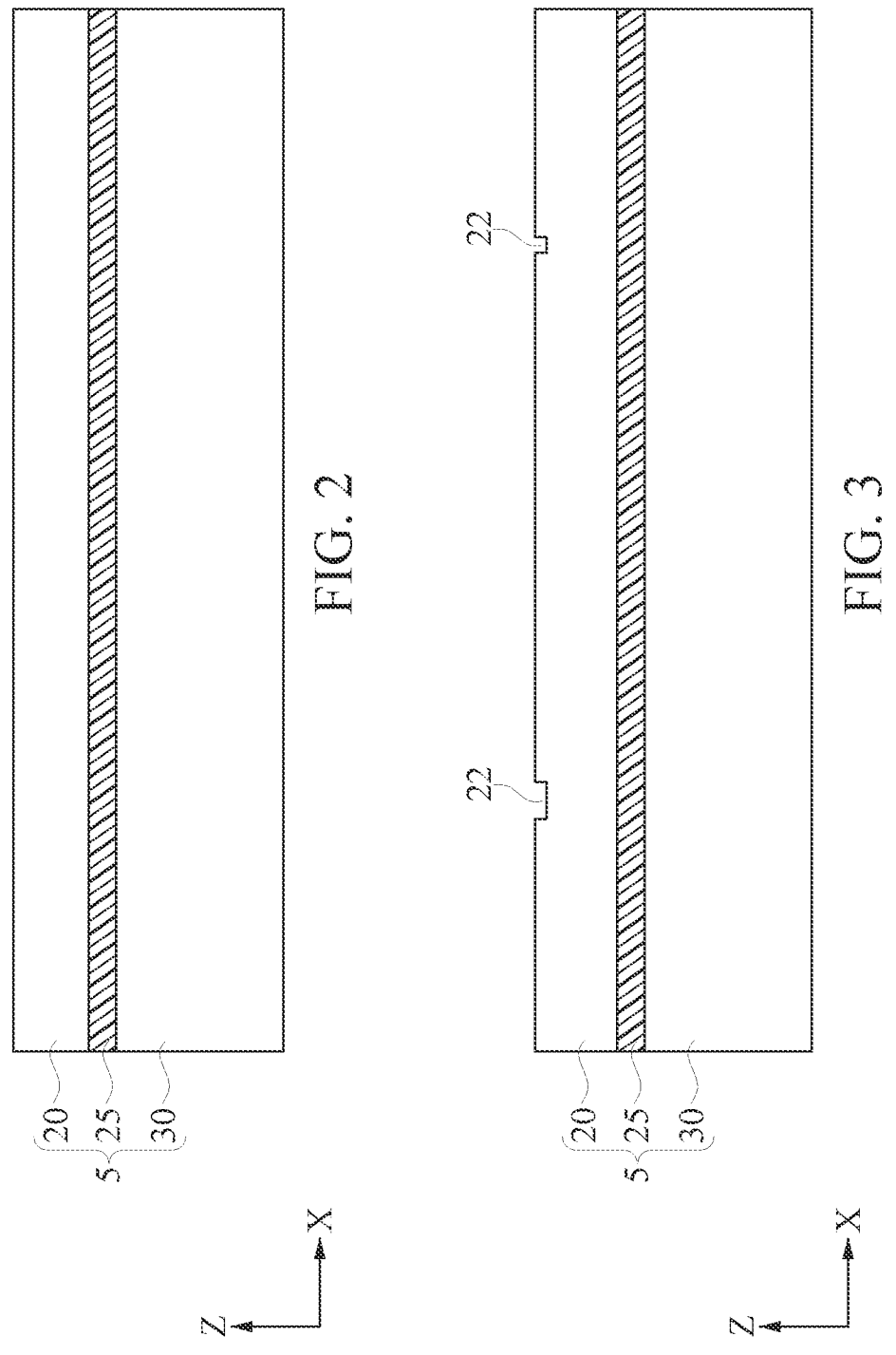
FIG. 2 shows a schematic cross sectional view of one of the various stages of a manufacturing operation for a dual MEMS device according to an embodiment of the present disclosure.
FIG. 3 shows a schematic cross sectional view of one of the various stages of a manufacturing operation for a dual MEMS device according to an embodiment of the present disclosure.

As shown in FIG. 2, in some embodiments, a silicon-on-insulator (SOI) substrate 5 is provided. The SOI substrate 5 includes a base layer 30, an insulator layer 25 and a top layer 20. In some embodiments, the top layer 20 is a doped silicon layer as a first silicon layer 20, and the base layer 30 is also a doped silicon layer as a second silicon layer 30. The insulator layer 25 is a silicon oxide layer as a second dielectric layer 25 (see FIG. 1A), in some embodiments. In other embodiments, at least one of the base layer 30 and the top layer 20 is made of diamond or germanium, Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. In other embodiments, the second dielectric layer 25 includes silicon nitride, SiOC, SiOCN or SiON. In some embodiments, the thickness of the first silicon layer 20 is in a range from about 300 nm to about 3000 nm depending on the functionalities of the MEMS device. In some embodiments, the thickness of the second dielectric layer 25 is in a range from about 100 nm to about 5000 nm.

Next, as shown in FIG. 3, a patterning operation including one or more lithography and etching processes is performed to form one or more stopper patterns 22 in the first silicon layer 20 at the regions where a proof mass structure, an anchor structure and/or an arm structure of the first MEMS structure 200 is subsequently formed. The stopper patterns 22 are recesses and/or grooves.

Figures 4A, 4B:
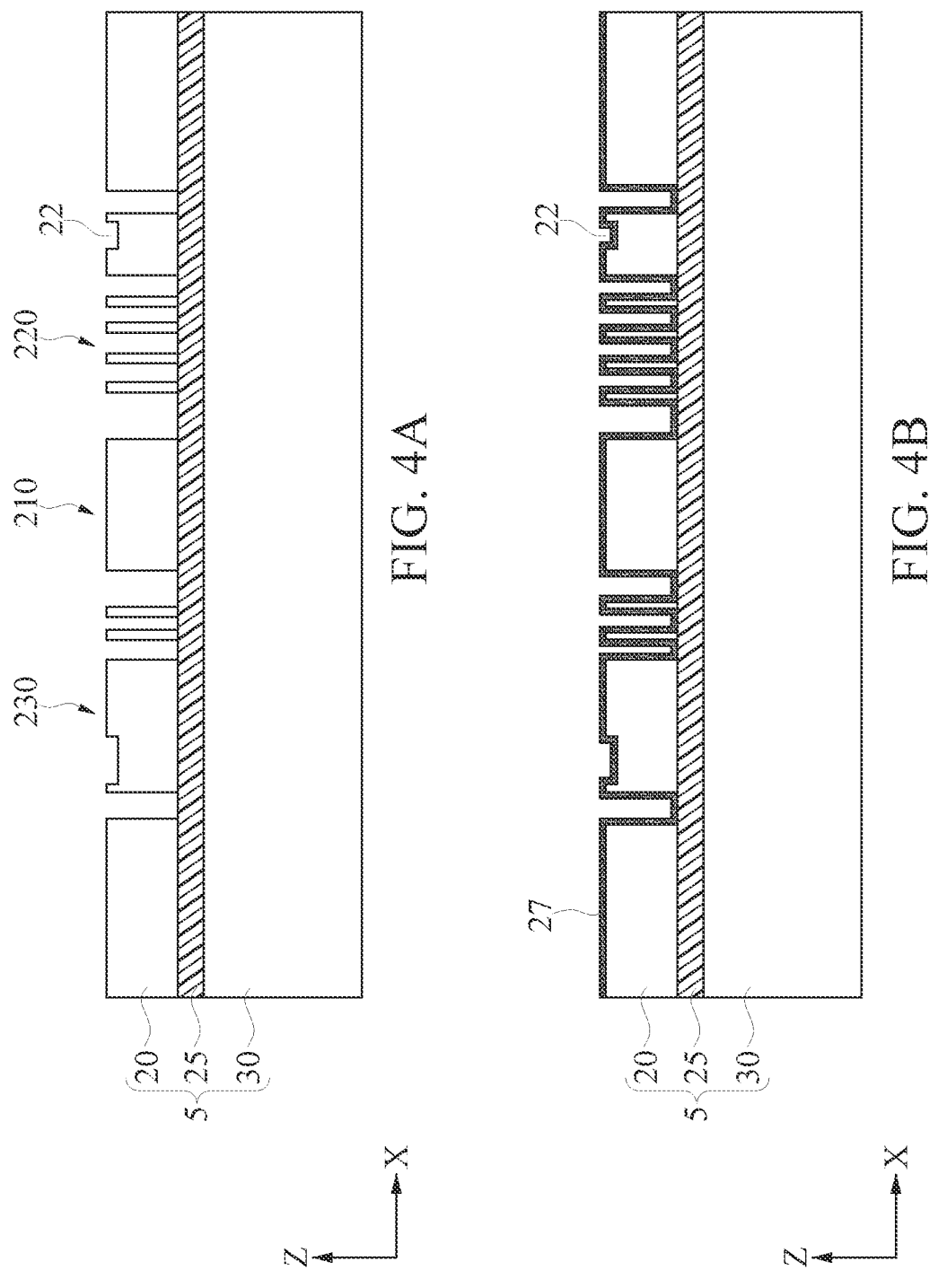
FIG. 4A shows a schematic cross sectional view of one of the various stages of a manufacturing operation for a dual MEMS device according to an embodiment of the present disclosure.
FIG. 4B shows a schematic cross sectional view of one of the various stages of a manufacturing operation for a dual MEMS device according to another embodiment of the present disclosure.

Then, as shown in FIG. 4A, the first silicon layer 20 is patterned by using one or more lithography and etching operations to form first MEMS patterns for the anchor structures 210, the capacitor structures 220 and the proof mass structure 230. In some embodiments, one or more plasma dry etching and/or wet etching operations are performed to pattern the first silicon layer 20. The etching operation substantially stops at the second dielectric layer 25. Since the bottoms of the first MEMS patterns are covered by the second dielectric layer 25 at this stage of the manufacturing operation, damage otherwise caused by plasma dry etching to the bottom of the first MEMS patterns can be avoided.

In some embodiments, after the first MEMS patterns are formed, one or more additional dielectric layers 27 are formed as a third dielectric layer over the patterned first MEMS patterns, as shown in FIG. 4B. In some embodiments, the third dielectric layer 27 includes silicon oxide formed by chemical vapor deposition (CVD), atomic layer deposition (ALD), physical vapor deposition (PVD) or any other suitable film formation method. In other embodiments, a thermal oxidation process is performed to form the third dielectric layer.

Figures 5A, 5B, 5C:
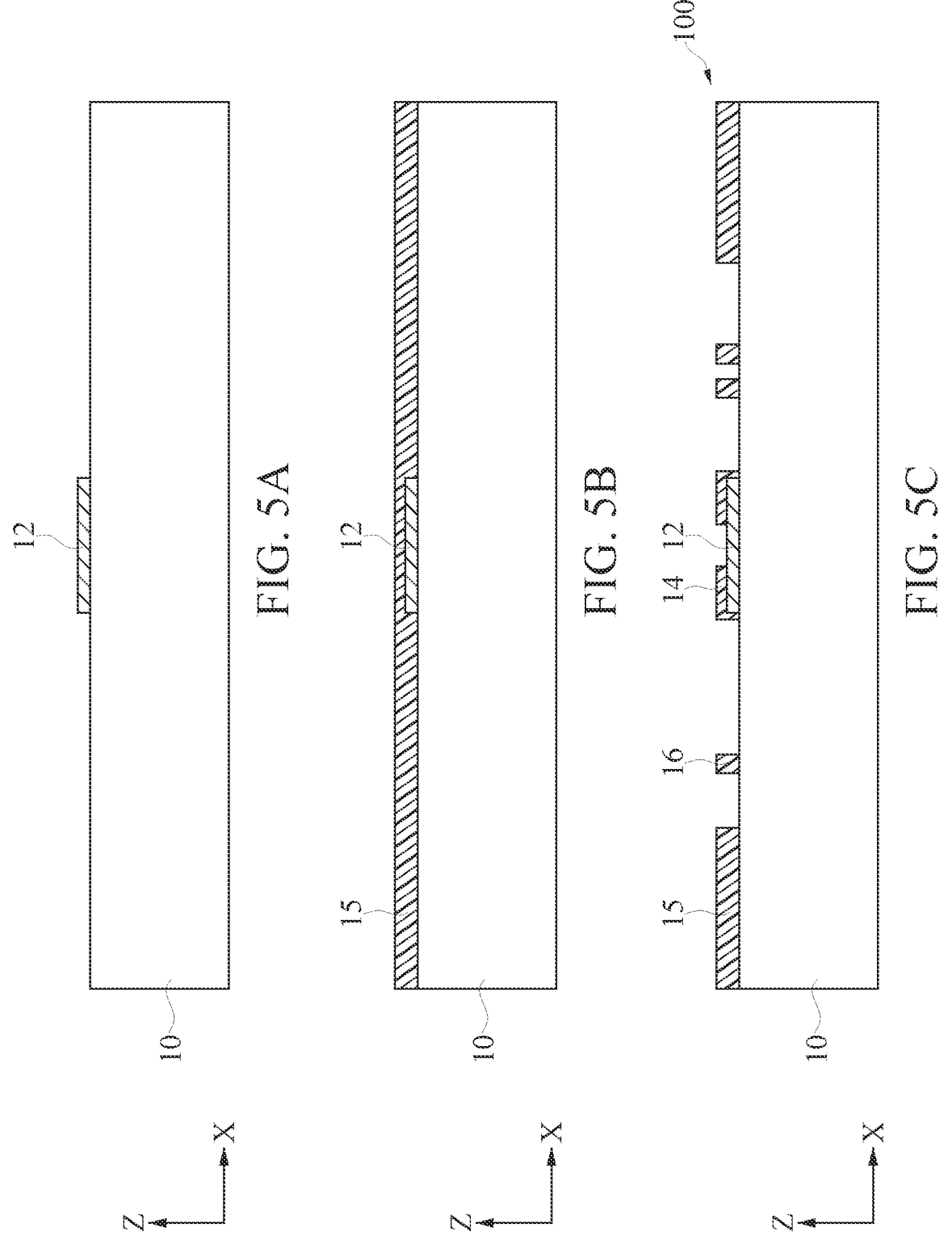
FIGS. 5A, 5B and 5C show schematic cross sectional views of the various stages of a manufacturing operation for a dual MEMS device according to an embodiment of the present disclosure.

FIGS. 5A-5C show various stages of manufacturing operations for a circuit substrate 100 in accordance with an embodiment of the present disclosure.

The circuit substrate 100 includes a substrate 10, such as a silicon substrate, and includes electronic circuitry formed on the surface area of the substrate 10. The electronic circuitry includes one or more amplifiers, signal processors, and/or I/O circuits formed by a CMOS technology.

As shown in FIG. 5A, one or more pad electrodes 12 are formed over the circuit substrate 100. The pad electrodes 12 are electrically connected to one or more electrodes of the electronic circuitry formed in the circuit substrate. The pad electrodes 12 are made of Al or an Al alloy, such as AlCu. Copper, gold, silver, and alloys thereof are also used for the pad electrodes 12 in some embodiments. The pad electrodes 12 are formed by CVD, PVD, electroplating or any other film formation method, and one of more lithography and etching operations.

Further, as shown in FIG. 5B, a dielectric layer 15 as a first dielectric layer is formed over the pad electrodes 12 and the upper surface of the circuit substrate 100. In some embodiments, the first dielectric layer 15 includes silicon oxide formed by CVD, PVD, ALD or any other film formation method. In some embodiments, the thickness of the first dielectric layer 15 is in a range from about 100 nm to about 5000 nm. In some embodiments, after the first dielectric layer 15 is formed, a planarization operation, such as a chemical mechanical polishing operation, is performed to planarize the surface of the first dielectric layer 15.

Then, as shown in FIG. 5C, by using one or more lithography and etching operations, the first dielectric layer 15 is patterned to form the circuit substrate 100 (see FIG. 1A). The patterned first dielectric layer 15 includes an electrode cover layer 14 having an opening over the pad electrode 12 and one or more support layers 16. The support layers 16 are used to support large patterns of the first MEMS patterns during a subsequent attaching process.

Figures 6, 7:
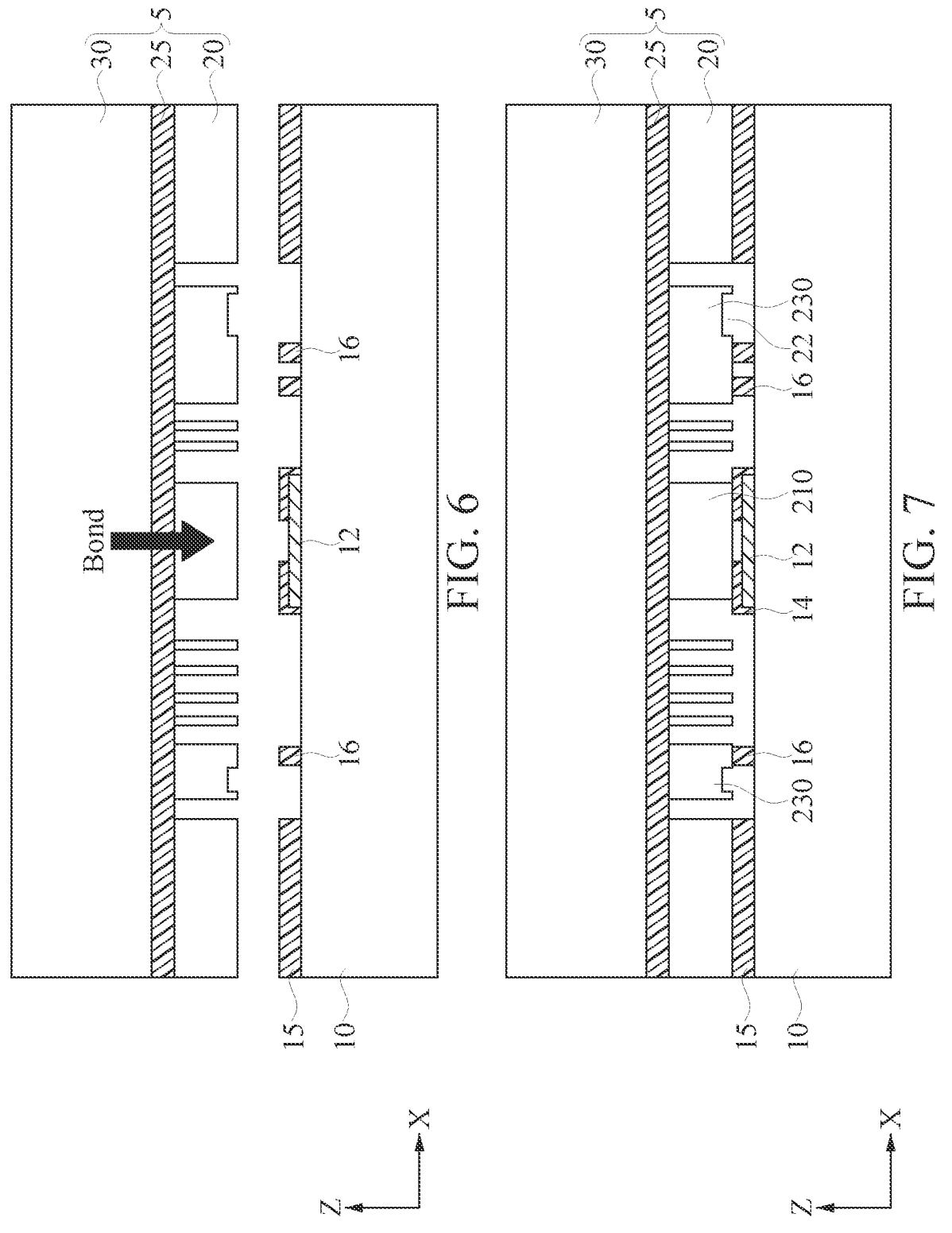
FIG. 6 shows a schematic cross sectional view of one of the various stages of a manufacturing operation for a dual MEMS device according to an embodiment of the present disclosure.
FIG. 7 shows a schematic cross sectional view of one of the various stages of a manufacturing operation for a dual MEMS device according to an embodiment of the present disclosure.

After the structures shown in FIG. 4A and FIG. 5C are formed, the circuit substrate 100 shown in FIG. 5C and the patterned SOI substrate 5 shown in FIG. 4A are attached together. In some embodiments, the patterned SOI substrate 5 shown in FIG. 4A is flipped and placed over the circuit substrate 100 as shown in FIG. 6. Then, by using known silicon oxide bonding technology (oxide fusion bonding), the patterned SOI substrate 5 is bonded to the circuit substrate 100 through the first dielectric layer 15, as shown in FIG. 7. In some embodiments, as shown in FIG. 7, one or more support layers 16 are attached to the first proof mass structure 230 at regions where no stopper pattern 22 is formed. In some embodiments, part of the electrode cover layer 14 is attached to the anchor structures 210, as shown in FIG. 7. Since the large patterns, such as anchor structures, proof mass structures and X,Y-arms are supported by the support layer 16, it is possible to avoid undesirable bending of the large patterns. Although not shown in FIG. 7, one or more additional support layers are disposed between the comb electrodes of the first MEMS patterns and the surface of the circuit substrate 100.

Figures 8, 9:
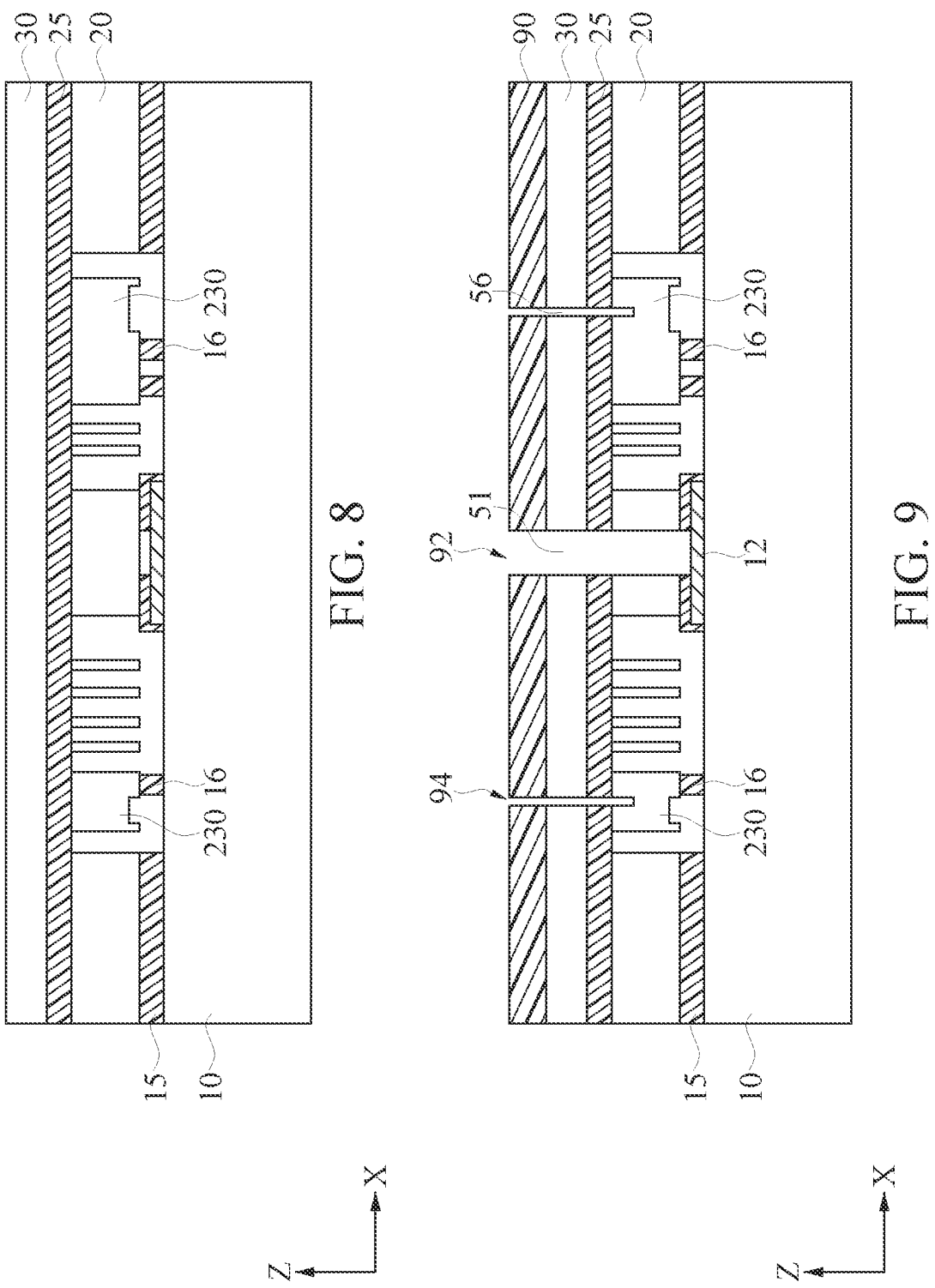
FIG. 8 shows a schematic cross sectional view of one of the various stages of a manufacturing operation for a dual MEMS device according to an embodiment of the present disclosure.
FIG. 9 shows a schematic cross sectional view of one of the various stages of a manufacturing operation for a dual MEMS device according to an embodiment of the present disclosure.

Next, as shown in FIG. 8, the backside of the second silicon layer 30 is thinned. In some embodiments, a grinding process is performed to reduce the thickness of the second silicon layer 30. In certain embodiments, a CMP operation is performed as the grinding process. In some embodiments, the thickness of the thinned second semiconductor layer 30 is in a range from about 200 nm to about 2000 nm depending on the functionalities of the MEMS device. In some embodiments, the thickness of the thinned second silicon layer 30 is equal to or smaller than the thickness of the first silicon layer 20.

Subsequently, a photo resist layer 90 is formed over the thinned second silicon layer 30, and patterned by using one or more lithography operations. In some embodiments, the lithography operation includes ultra violet (UV) lithography, deep UV (DUV) lithography or electron beam lithography. The resist pattern includes one or more first openings 92 corresponding to the first via electrodes 50 and one or more second openings 94 corresponding to the second via electrodes 55.

After the resist pattern 90 is formed, the second silicon layer 30, the second dielectric layer 25, the first silicon layer and the first dielectric layer 15 are patterned to form a first via hole 51 and a second via hole 56, as shown in FIG. 9. In some embodiments, the patterning includes one plasma dry etching operation. The one etching operation means an etching operation performed without removing an etching object from an etching chamber.

In some embodiments, a size (e.g., diameter) the first opening 92 of the resist pattern 90 for the first via electrode 50 is greater than a size (e.g., diameter) the second opening 94 of the resist pattern 90 for the second via electrode 55. Since an etching rate for a small opening is smaller than an etching rate for a large opening, the etching under the first openings 94 stops at the middle of the first silicon layer 20 when the etching under the second opening 92 reaches the pad electrode 12.

In some embodiments, the diameter of the first opening 92 is in a range from about 1 µm to about 10 µm, and the diameter of the second opening 94 is in a range from about 0.1 µm to about 2 µm. When the shape of the first and/or second openings 92, 94 is not circular, the diameter is an average diameter of the opening.

In some embodiments, the diameter of the first via hole 51 at the surface of the second silicon layer at the interface between the second dielectric layer 25 and the second silicon layer 30 is in a range from about 1 µm to about 10 µm, and the diameter of the second via hole 56 at the surface of the second silicon layer at the interface between the second dielectric layer 25 and the second silicon layer 30 is in a range from about 0.1 µm to about 2 µm. In some embodiments, an area of the second via hole 56 is about 30% to about 80% of an area of the first via hole at the surface of the second silicon layer or at the interface between the second dielectric layer 25 and the second silicon layer 30. When the size different between the first opening 92 and the second opening 94 is too large, the second via hole 56 would pass through the first silicon layer, and when the size different between the first opening 92 and the second opening 94 is too small, the second via hole 56 would not reach the first silicon layer 20.

The bottom of the second via hole 56 is located at the middle of the first silicon layer. When the thickness of the first silicon layer is T1, the bottom of the second via hole 56 is located at from $0.1 \times T1$ to $0.9 \times T1$ measured from the upper surface of the first silicon layer 20. After the first and second via holes are formed, the photo resist layer 90 is removed by an appropriate resist removal operation.

As set forth above, in the present embodiments, one etching operation is performed to form via holes having different depths and thus it is possible to reduce manufacturing cost.

Subsequently, the first via hole 51 and the second via hole 56 are filled with a conductive material. In some embodiments, the conductive material includes one or more of W, Cu, Al, Ni, Co or alloys thereof or any other suitable conductive material. In certain embodiment, W is used. The conductive layers can be formed by CVD, PVD including sputtering, electroplating or any other suitable film formation method. In some embodiments, the conductive material is formed to fill the via holes and over the surface of the second silicon layer 30 and patterned by using one or more lithography and etching operations. The first via electrode 50 is connected to the pad electrode 12 on the circuit substrate 100. In some embodiments, as shown in FIG. 10, the first via electrode 50 and the second via electrode 55 include a lateral extension part formed on the surface of the second silicon layer 20.

Figures 10, 11:
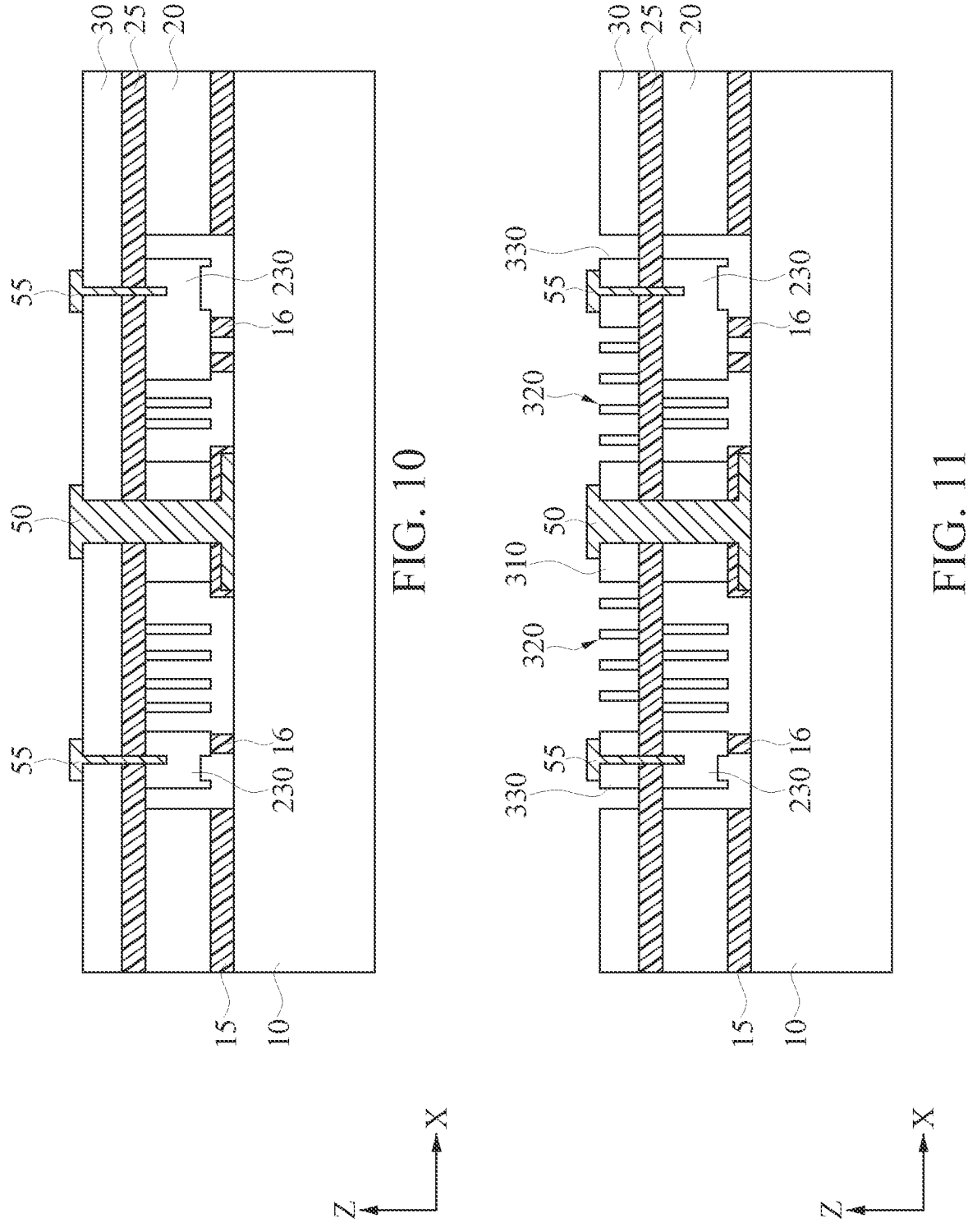
FIG. 10 shows a schematic cross sectional view of one of the various stages of a manufacturing operation for a dual MEMS device according to an embodiment of the present disclosure.
FIG. 11 shows a schematic cross sectional view of one of the various stages of a manufacturing operation for a dual MEMS device according to an embodiment of the present disclosure.

After the first and second via electrodes 50, 55 are formed, as shown in FIG. 11, the second silicon layer 30 is patterned by using one or more lithography and etching operations to form second MEMS patterns for the anchor structure 310, the capacitor structures 320 and the proof mass structure 330. In some embodiments, one or more plasma dry etching and/or wet etching operations are performed to pattern the second silicon layer 30. The etching operation substantially stops at the second dielectric layer 25. Since the bottoms of the second MEMS patterns are covered by the second dielectric layer 25 at this stage of the manufacturing operation, damage otherwise caused by plasma dry etching to the bottom of the second MEMS patterns can be avoided.

Figures 12, 13:
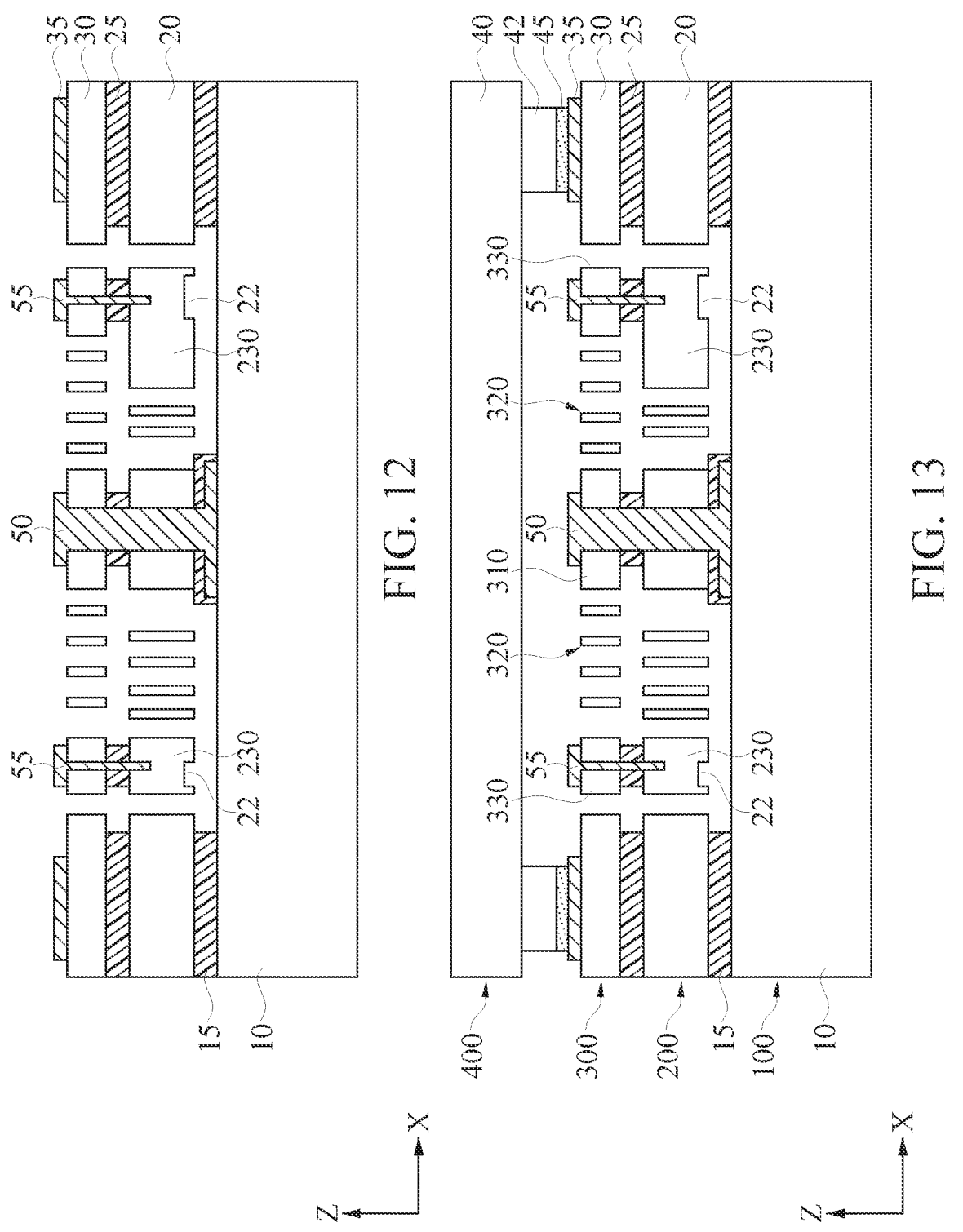
FIG. 12 shows a schematic cross sectional view of one of the various stages of a manufacturing operation for a dual MEMS device according to an embodiment of the present disclosure.
FIG. 13 shows a schematic cross sectional view of one of the various stages of a manufacturing operation for a dual MEMS device according to an embodiment of the present disclosure.

Next, as shown in FIG. 12, the second MEMS patterns and the first MEMS patterns are released by removing part of the second dielectric layer 25 and the first dielectric layer 15. In some embodiments, the second and first dielectric layers are removed by using a chemical dry etching. In some embodiments, when the second and first dielectric layers are made of silicon oxide, a HF (hydrogen fluoride)vapor is used to remove the silicon layers. No wet etching is performed to remove the second and first dielectric layers in some embodiments.

In the present embodiments, since a chemical dry etching is used, it is possible to suppress pattern sticking caused by surface tension of a wet etchant and to avoid plasma damage to the MEMS patterns. Moreover, since the stopper patterns 22 are formed at the bottom surface of the large patterns, it is also possible suppress pattern sticking of the large patterns.

In some embodiments, before or after the MEMS patterns are released, a first bonding layer 35 is formed on the frame 390 of the second MEMS structure 300. The first bonding layer 35 is formed by CVD, PVD including sputtering, electroplating or any other suitable film formation method, and by one or more lithography and etching operations.

Then, as shown in FIG. 13, a cover layer 400 having a second bonding layer 45 on the bottom surface of the leg portions 42 is attached to the second MEMS structure 300 by eutectic bonding in some embodiments.

Figures 14, 15:
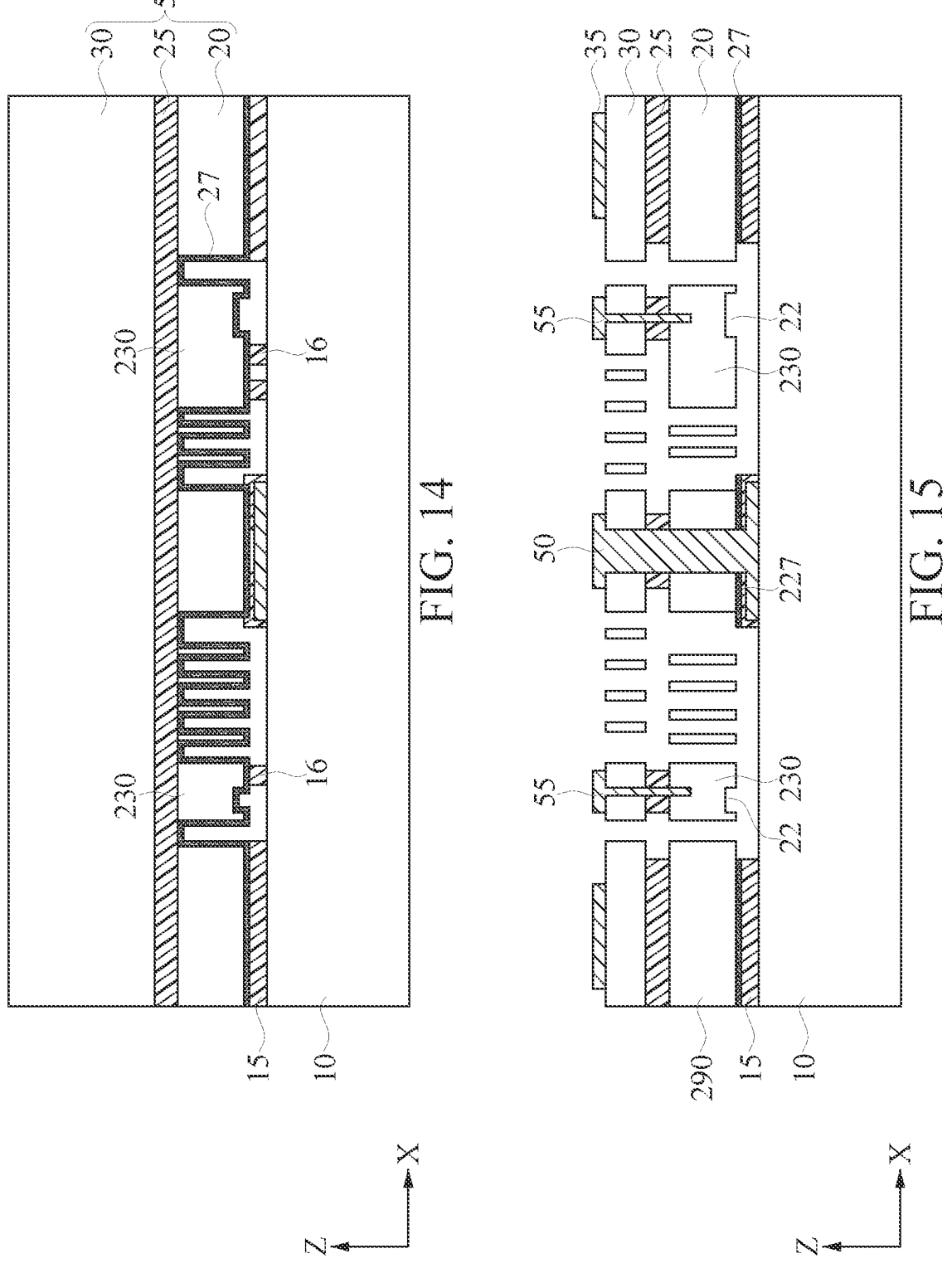
FIG. 14 shows a schematic cross sectional view of one of the various stages of a manufacturing operation for a dual MEMS device according to another embodiment of the present disclosure.
FIG. 15 shows a schematic cross sectional view of one of the various stages of a manufacturing operation for a dual MEMS device according to another embodiment of the present disclosure.

FIGS. 14 and 15 show various stages of manufacturing operations for a MEMS device in accordance with another embodiment of the present disclosure. It is understood that additional operations can be provided before, during, and after the processes shown by FIGS. 14 and 15, and some of the operations described below can be replaced or eliminated, for additional embodiments of the method. The order of the operations/processes may be interchangeable. Material, configuration, dimensions and/or processes the same as or similar to the foregoing embodiments described with FIGS. 2-13 may be employed in the following embodiments, and detailed explanation thereof may be omitted.

After the structure shown in FIG. 4B is formed, similar to FIG. 7, the SOI substrate 5 with the third dielectric layer 27 is bonded to the circuit substrate 100 as shown in FIG. 14. Since the third dielectric layer (e.g., made of silicon oxide) is provided, it is possible to enhance oxide-fusion bonding strength.

Then, the operations explained with respect to FIGS. 8-12 are performed and the first and second MEMS structures are released as shown in FIG. 15. During the chemical dry etching of the second and first dielectric layers 25, 15, part of the third dielectric layer 27 is also removed. As shown in FIG. 15, the third dielectric layer 27 remains at the bottom of the frame 290 and the first dielectric layer 15 and at the bottom of the first anchor structure 201 and the first dielectric layer 15. Subsequently, a cover layer 400 is attached to the second MEMS structures similar to FIG. 14.

Figures 16A, 16B, 16C, 16D, 16E, 16F:
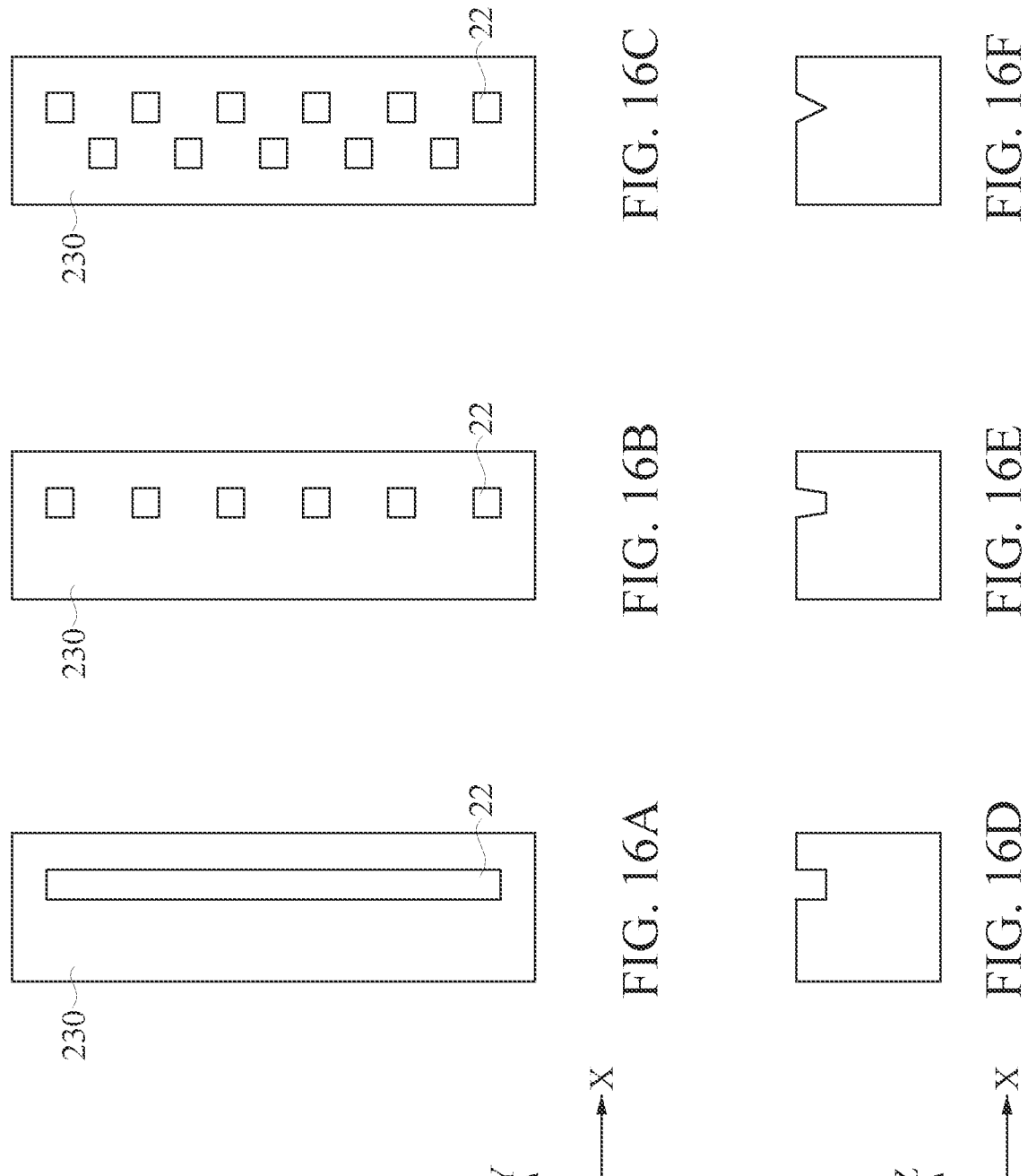
FIGS. 16A, 16B and 16C show plan views of a stopper pattern according to embodiments of the present disclosure.
FIGS. 16D, 16E and 16F show cross sectional views of a stopper pattern according to embodiments of the present disclosure.

FIGS. 16A-16C show plan views of a stopper pattern 22 and FIGS. 16D, 16E and 16F show cross sectional views of a stopper pattern according to embodiments of the present disclosure.

In some embodiments, the stopper pattern 22 has a line pattern (elongated rectangular pattern) extending along a longitudinal direction of the first proof mass structure 230 and/or first anchor structure. In some embodiments, when the first proof mass structure has a frame shape, the stopper pattern 22 also has a frame shape. In some embodiments, the stopper pattern 22 has discrete patterns as shown in FIGS. 16B and 16C. In some embodiments, the discrete patterns are arranged along a line extending along a longitudinal direction of the first proof mass structure 230 and/or first anchor structure, as shown in FIG. 16B. In other embodiments, the discrete patterns are two-dimensionally arranged as shown in FIG. 16C.

In some embodiments, the cross-sectional shape of the stopper pattern is rectangular as shown in FIG. 16D, trapezoidal as shown in FIG. 16E and/or a V-shape as shown in FIG. 16F.

In some embodiments, a support layer 16 also has the similar pattern (line and/or discrete patterns) to the stopper patterns shown in FIGS. 16A-16C. The support layer 16 is disposed on regions of the first proof mass structure 230 corresponding to the regions where no stopper pattern 22 is formed.

Figure 17:
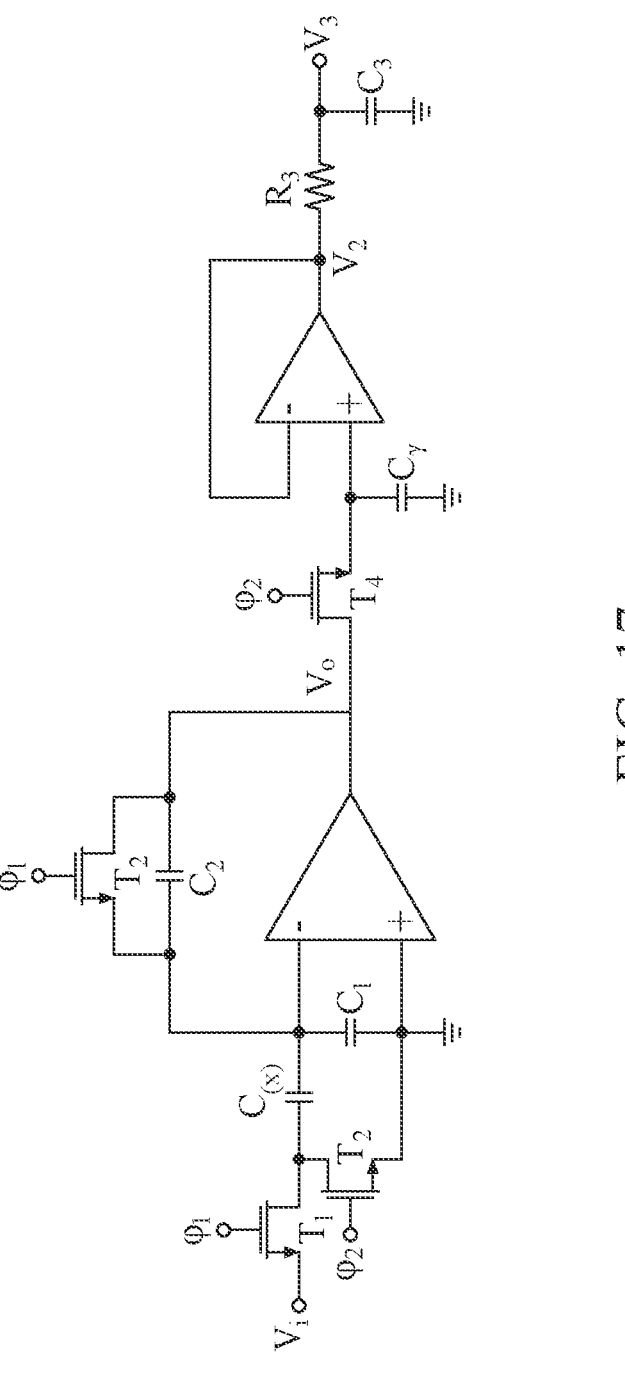
FIG. 17 shows a circuit diagram of a signal processing circuit according to an embodiment of the present disclosure.

FIG. 17 shows a circuit diagram of a signal processing circuit according to an embodiment of the present disclosure. The signal processing circuit includes one or more amplifiers constituted by CMOS transistors.

Figure 18:
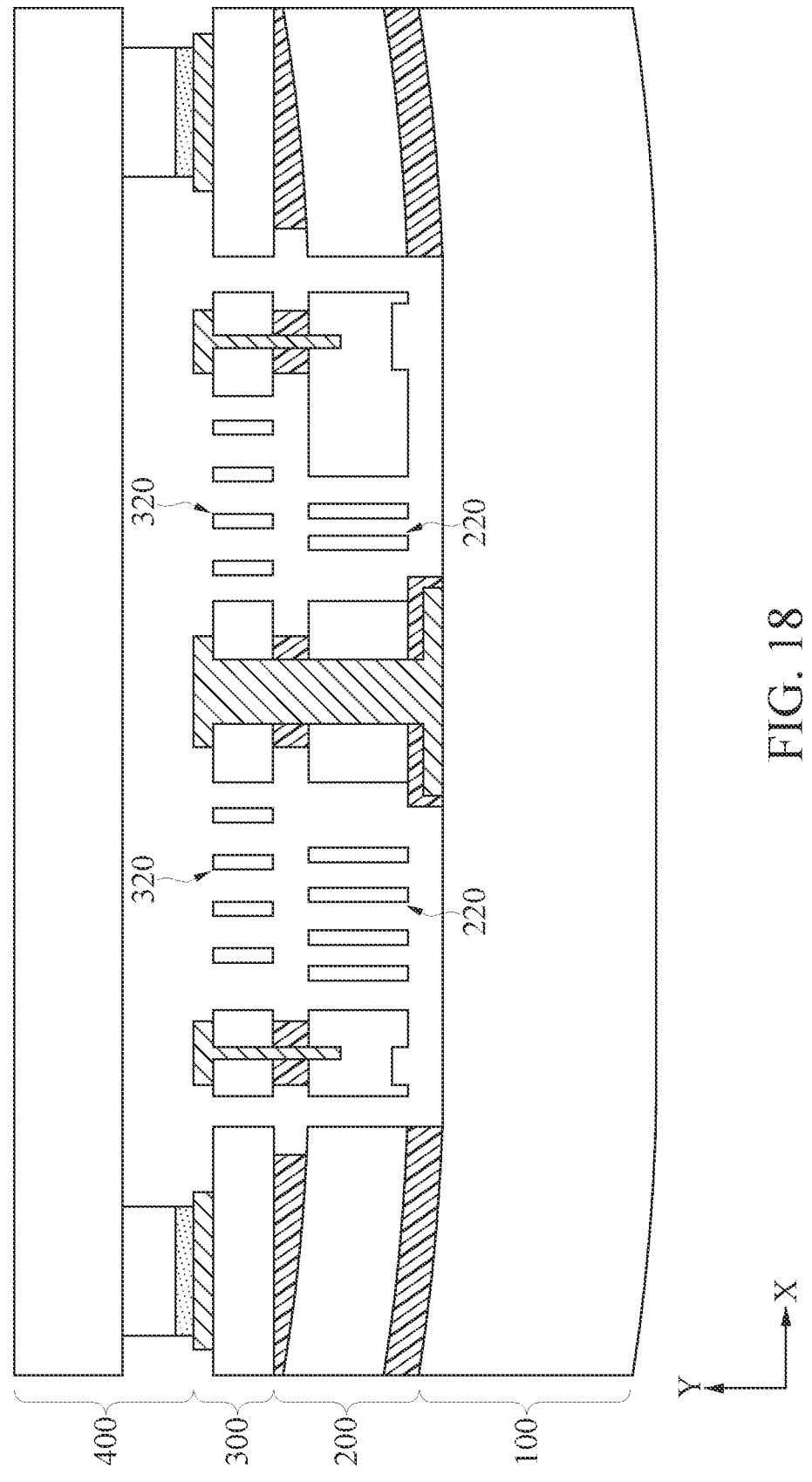
FIG. 18 shows a schematic cross sectional view illustrating effects of the present embodiment.

FIG. 18 shows a schematic cross sectional view illustrating effects of the present embodiment. As set forth above, the electrodes of the capacitance structures of the first MEMS structure 200 and the second MEMS structure 300 are mechanically floating over the circuit substrate 100. As shown in FIG. 18, even if the circuit substrate 100 is bent or deformed, gaps between the comb electrodes of the capacitance structures of the first MEMS structure 200 and the second MEMS structure 300 do not substantially change. Accordingly, it is possible to suppress an offset signal caused by the deformation of the circuit substrate 100.

The MEMS device according to the present disclosure can be any one of an accelerometer, a gyroscope, a pressure sensor, a microphone, an RF resonator, an RF switch, or an ultra-sonic transducer. Depending on the functionalities of the MEMS device, the configurations of the first MEMS structure and/or the second MEMS structure are modified. For example, in a case of a pressure sensor or a microphone, the comb electrodes of the second MEMS structure 300 are changed to one or more plate-shape electrodes.

The various embodiments or examples described herein offer several advantages over the existing art, as set forth above. It will be understood that not all advantages have been necessarily discussed herein, no particular advantage is required for all embodiments or examples, and other embodiments or examples may offer different advantages.

In accordance with one aspect of the present disclosure, a micro electro mechanical system (MEMS) includes a circuit substrate, a first MEMS structure disposed over the circuit substrate, and a second MEMS structure disposed over the first MEMS structure. In one or more of the foregoing and following embodiments, the MEMS further includes a cover disposed over the second MEMS structure. In one or more of the foregoing and following embodiments, the first MEMS structure includes a first anchor, the second MEMS structure includes a second anchor, and the MEMS further comprises a main via electrode passing through the first anchor and the second anchor and electrically connected to the circuit substrate. In one or more of the foregoing and following embodiments, the first MEMS structure includes a first proof mass, the second MEMS structure includes a second proof mass, and the MEMS further comprises a via connecting the first proof mass and the second proof mass. In one or more of the foregoing and following embodiments, a bottom of the via is located at a middle of the first proof mass. In one or more of the foregoing and following embodiments, the first MEMS structure includes a first capacitance sensor for detecting a capacitance change caused by a first direction movement and a second capacitance sensor for detecting a capacitance change caused by a second direction movement.

In accordance with another aspect of the present disclosure, a MEMS includes a circuit substrate, a first MEMS structure disposed over the circuit substrate, a first insulating layer disposed between the circuit substrate and the first MEMS structure, a second MEMS structure disposed over the first MEMS structure, a second insulating layer disposed between the first MEMS structure and the second MEMS structure, and a cover disposed over the second MEMS structure. The first MEMS includes a capacitance sensor for detecting movement in a first direction, and the first MEMS and the second MEMS are configured to detect movement in a second direction perpendicular to the first direction. In one or more of the foregoing and following embodiments, the first MEMS structure includes one or more first anchors and a first proof mass, the second MEMS structure includes a second anchor and a second proof mass, the second anchor is connected to one of the one or more first anchors by a first via electrode, and the second proof mass is connected to the first proof mass by a second via electrode. In one or more of the foregoing and following embodiments, an area of the first via electrode is greater than an area of the second via electrode measured at a cross section of the second insulating layer. In one or more of the foregoing and following embodiments, the area of the second via electrode is 30% to 80% of the area of the first via electrode. In one or more of the foregoing and following embodiments, the first via is electrically connected to the circuit substrate. In one or more of the foregoing and following embodiments, a bottom of the second via electrode is located at a middle of the first proof mass. In one or more of the foregoing and following embodiments, the first MEMS structure further includes a third via coupled to one of the one or more first anchors different from the one of the one or more first anchors including the first via electrode, and the third via is electrically connected to the circuit substrate. In one or more of the foregoing and following embodiments, one or more recesses are formed at a bottom of the first proof mass facing the circuit substrate. In one or more of the foregoing and following embodiments, the first proof mass is supported by one or more springs each connected to one of the one or more first anchors. In one or more of the foregoing and following embodiments, each of the one or more springs has a pulse-wave shape in plan view.

In accordance with another aspect of the present disclosure, a MEMS includes a circuit substrate, a first MEMS structure disposed over the circuit substrate, a second MEMS structure disposed over the first MEMS structure, and a cover disposed over the second MEMS structure. The circuit substrate includes a signal processing circuit for processing a signal transmitted from at least one of the first MEMS structure or the second MEMS structure. In one or more of the foregoing and following embodiments, the first MEMS structure includes a first anchor, a second anchor, a first proof mass, first comb electrodes coupled to the second anchor and second comb electrodes coupled to the first proof mass, the second MEMS structure includes a third anchor, a second proof mass and third comb electrodes coupled to the second anchor, the third anchor and the first anchor are coupled to the signal processing circuit by a first via electrode, and the second anchor is coupled to the signal processing circuit by a second via electrode. In one or more of the foregoing and following embodiments, the second proof mass is connected to the first proof mass by a third via electrode. In one or more of the foregoing and following embodiments, the third via does not pass through the first proof mass.

In accordance with an aspect of the present disclosure, in a method of manufacturing a micro electro mechanical system (MEMS), first MEMS patterns for a first MEMS structure are formed on a first dielectric layer disposed on a first substrate, the first MEMS patterns are attached to a circuit substrate via a second dielectric layer, second MEMS patterns for a second MEMS structure are formed in the first substrate, and the first MEMS patterns and the second MEMS patterns are released by removing part of the first dielectric layer and part of the second dielectric layer using a chemical dry etching. In one or more of the foregoing and following embodiments, the first dielectric layer and the second dielectric layer are made of silicon oxide, and the chemical dry etching utilizes vapor HF. In one or more of the foregoing and following embodiments, a cover is further attached by using eutectic bonding. In one or more of the foregoing and following embodiments, the second dielectric layer is formed on the circuit substrate, and the second dielectric layer includes a support pattern to be in contact with an anchor included in the first MEMS patterns. In one or more of the foregoing and following embodiments, the anchor has a stopper pattern at a region not to be in contact with the support pattern. In one or more of the foregoing and following embodiments, the support pattern is removed by the chemical dry etching. In one or more of the foregoing and following embodiments, the first MEMS patterns are formed by etching a second substrate on the first dielectric layer using plasma dry etching and the plasma dry etching stops at the first dielectric layer. In one or more of the foregoing and following embodiments, the second MEMS patterns are formed by etching the first substrate using plasma dry etching and the plasma dry etching stops at the first dielectric layer. In one or more of the foregoing and following embodiments, before attaching the first MEMS patterns to the circuit substrate, a third dielectric layer is formed over the first MEMS patterns.

In accordance with another aspect of the present disclosure, in a method of manufacturing a MEMS, first MEMS patterns for a first MEMS structure are formed in a first substrate on a first dielectric layer disposed on a second substrate, the first MEMS patterns are attached to a circuit substrate via a second dielectric layer, a first via hole passing through the second substrate, the first electric layer, the first substrate and the second dielectric layer is formed, and a second via hole passing through the second substrate and the first dielectric layer is formed. A bottom of the second via hole is located in the first substrate. A first via electrode is formed by filling the first via hole with a conductive material, and a second via electrode is formed by filling the second via hole with the conductive material. Second MEMS patterns for a second MEMS structure are formed in the second substrate, and the first MEMS patterns and the second MEMS patterns are released by removing part of the first dielectric layer and part of the second dielectric layer using a chemical dry etching. In one or more of the foregoing and following embodiments, the first dielectric layer and the second dielectric layer are made of silicon oxide, and the chemical dry etching utilizes vapor HF. In one or more of the foregoing and following embodiments, a diameter of the first via hole is greater than a diameter of the second via hole. In one or more of the foregoing and following embodiments, the first via hole and the second via hole are formed by one etching operation. In one or more of the foregoing and following embodiments, a cover is attached by using eutectic bonding. In one or more of the foregoing and following embodiments, the circuit substrate includes an electrode, and the first via contact is formed to contact the electrode. In one or more of the foregoing and following embodiments, before attaching the first MEMS patterns to the circuit substrate, a third dielectric layer is formed over the first MEMS patterns.

In accordance with another aspect of the present disclosure, in a method of manufacturing a MEMS, first MEMS patterns are formed in a first silicon layer of a silicon-on-insulator (SOI) substrate. The SOI substrate includes a second silicon layer, a first dielectric layer on the second silicon layer and the first silicon layer on the first dielectric layer. The first MEMS patterns are attached to a circuit substrate via a second dielectric layer. The second silicon layer is thinned. Second MEMS patterns are formed in the thinned second silicon layer. The first MEMS patterns and the second MEMS patterns are released by removing part of the first dielectric layer and part of the second dielectric layer using a chemical dry etching. A cover is attached over to the second silicon layer. In one or more of the foregoing and following embodiments, a stopper pattern is formed in the first silicon layer, and the stopper pattern is shallower than the first MEMS patterns. In one or more of the foregoing and following embodiments, after the first MEMS patterns are attached to the circuit substrate, a first via hole passing through the second silicon layer, the first electric layer, the first silicon layer and the second dielectric layer, and a second via hole passing through the second silicon layer and the first dielectric layer, a bottom of the second via hole being located in the first silicon layer, are formed. A first via electrode is formed by filling the first via hole with a conductive material, and a second via electrode is formed by filling the second via hole with the conductive material. In one or more of the foregoing and following embodiments, a diameter of the first via hole is greater than a diameter of the second via hole, and the first via hole and the second via hole are formed by one etching operation using one photo resist pattern.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
a first structure disposed over the substrate;
a second structure disposed over the first structure; and
a cover disposed over the second structure,
wherein the first structure includes a first capacitance sensor configured to detect movement along a first direction and a second capacitance sensor configured to detect movement along a second direction perpendicular to the first direction,
the first structure includes one or more first anchors and a first proof mass, wherein the first proof mass is supported by one or more springs each connected to one of the one or more first anchors,
the second structure includes a second anchor and a second proof mass, wherein the second anchor is connected to one of the one or more first anchors by a first via electrode, and
the second proof mass is connected to the first proof mass by a second via electrode.

2. The device of claim 1, wherein an area of the first via electrode is greater than an area of the second via electrode.

3. The device of claim 1, wherein an area of the second via electrode is 30% to 80% of the area of the first via electrode.

4. The device of claim 1, wherein a bottom of the second via electrode is located at a middle of the first proof mass.

5. The device of claim 1, wherein the first via electrode is electrically connected to the substrate.

6. A device, comprising:
a substrate;
a first structure disposed over the substrate;
a second structure disposed over the first structure; and
a cover disposed over the second structure,
wherein the first structure includes one or more first anchors and a first proof mass and the first proof mass is supported by one or more springs each connected to one of the one or more first anchors, and
one or more recesses are formed at a bottom of the first proof mass facing the substrate.

7. The device of claim 6, wherein each of the one or more springs has a pulse-wave shape in plan view.

8. The device of claim 6, wherein the second structure includes a second anchor and a second proof mass,
wherein the second anchor is connected to one of the one or more first anchors by a first via electrode.

9. The device of claim 8, wherein the second proof mass is connected to the first proof mass by a second via electrode.

10. The device of claim 6, wherein:

the first structure further includes a third via electrode coupled to one of the one or more first anchors different from the one of the one or more first anchors including the first via electrode, and the third via electrode is electrically connected to the substrate.

11. A device, comprising:

a substrate;

a first structure disposed over the substrate;

a second structure disposed over the first structure; and a cover disposed over the second structure, wherein the first structure includes: one or more of first anchors, a plurality of first electrodes arranged along a first direction and coupled to one of the one or more first anchors, and a plurality of second electrodes arranged along the first direction and coupled to a first proof mass, and wherein the first electrodes and second electrodes are alternately arranged along the first direction.

12. The device of claim 11, wherein the first structure further comprises a plurality of third electrodes arranged along a second direction perpendicular to the first direction and coupled to a second anchor, and a plurality of fourth electrodes arranged along the second direction and coupled to the first proof mass, and wherein the third electrodes and fourth electrodes are alternately arranged along the second direction.

13. The device of claim 12, wherein the second structure includes a third anchor, a second proof mass and a plurality of fifth electrodes coupled to the second anchor.

14. The device of claim 13, wherein the third anchor and the first anchor are coupled to the substrate by the first via electrode.

15. The device of claim 11, wherein the first proof mass is supported by one or more springs each connected to one of the one or more first anchors.

16. The device of claim 15, wherein each of the one or more springs has a pulse-wave shape in plan view.

17. The device of claim 1, wherein the proof mass has a frame shape in plan view.

18. The device of claim 6, wherein the proof mass has a frame shape in plan view.

19. The device of claim 11, wherein the proof mass has a frame shape in plan view.

20. The device of claim 9, wherein an area of the first via electrode is greater than an area of the second via electrode.

* * * * *